(12) United States Patent
Ma et al.

(10) Patent No.: US 8,831,241 B2
(45) Date of Patent: Sep. 9, 2014

(54) EARPHONE JACK DRIVE CIRCUIT

(75) Inventors: Bin-Song Ma, Shenzhen (CN);
Yong-Song Shi, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 291 days.

(21) Appl. No.: 13/430,700

(22) Filed: Mar. 27, 2012

(65) Prior Publication Data

US 2013/0236025 A1 Sep. 12, 2013

(30) Foreign Application Priority Data

Mar. 8, 2012 (CN) .......................... 2012 1 0059446

(51) Int. Cl.
*H04R 1/10* (2006.01)

(52) U.S. Cl.
USPC .......................................................... 381/74

(58) Field of Classification Search
CPC .... H04R 1/1014; H04R 1/1016; H04R 5/033; H04R 5/04; H04R 2420/05; H04R 2420/07
USPC .......................................................... 381/74
See application file for complete search history.

(56) References Cited

U.S. PATENT DOCUMENTS

| 5,488,258 | A | 1/1996 | Honda |
| 5,570,427 | A | 10/1996 | Nishioka |
| 6,069,960 | A * | 5/2000 | Mizukami et al. ............. 381/74 |
| 6,516,067 | B1 | 2/2003 | Lee |
| 7,519,185 | B2 * | 4/2009 | Liang ............................. 381/74 |
| 8,280,038 | B2 * | 10/2012 | Johnson et al. ............... 379/430 |

FOREIGN PATENT DOCUMENTS

EP 0862265 A2 9/1998

* cited by examiner

*Primary Examiner* — Simon Sing
(74) *Attorney, Agent, or Firm* — Novak Druce Connolly Bove + Quigg LLP

(57) ABSTRACT

An earphone jack drive circuit applied in an electronic device is provided. The earphone jack drive circuit includes a mute circuit; a micro-controller including a detect pin and a control pin; a delay switch circuit including a resistance, a capacitance, an npn transistor and a first current-limiting resistance. During the plugging in or the unplugging out of the earphone, any momentary logic high of the detect pin charges the capacitance, the capacitance discharges when the detect pin is set to be logic low. For a period, the npn transistor is kept on, the connector of the npn transistor is set to be logic low, the input port of the mute circuit is set to be logic low, thereby the mute circuit is controlled to perform the mute mode during the period to eliminate the popping noises of connection and disconnection.

6 Claims, 1 Drawing Sheet

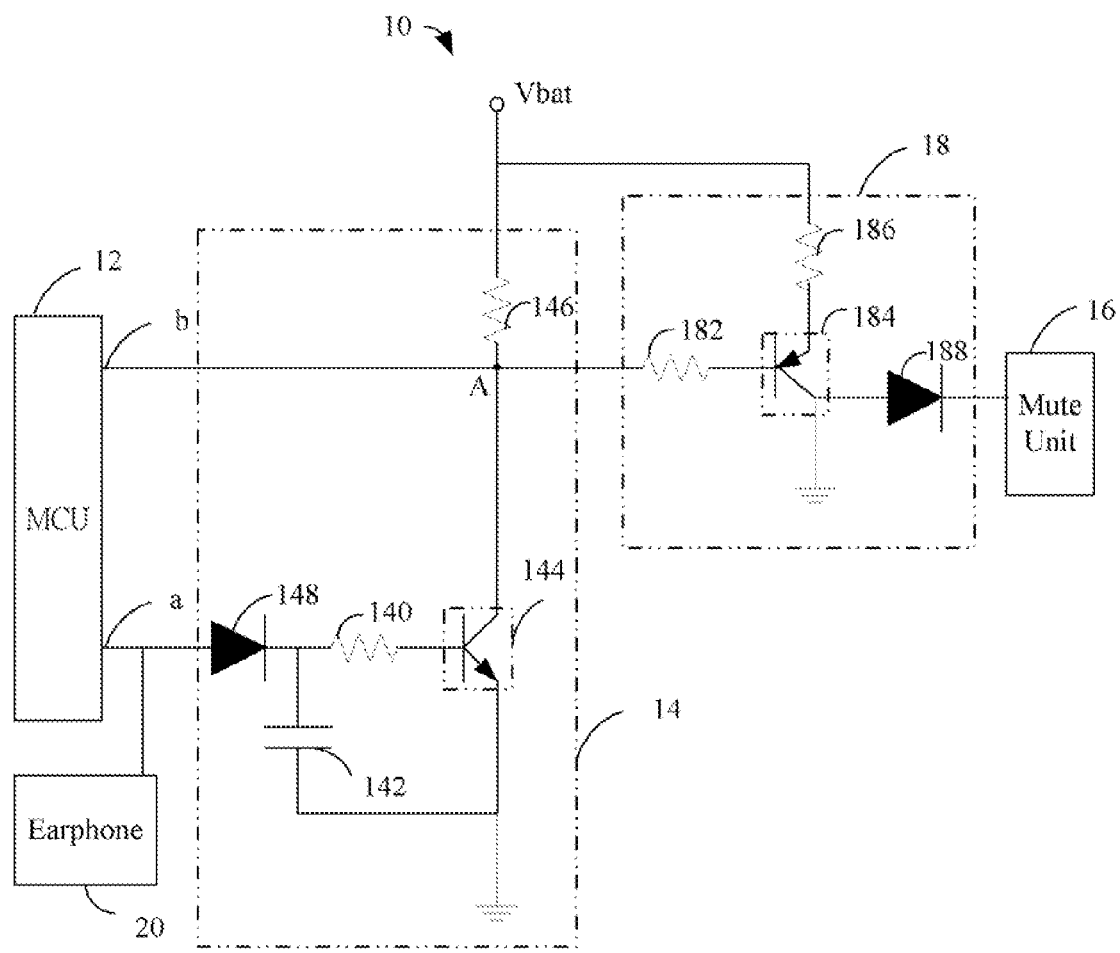

EARPHONE JACK DRIVE CIRCUIT

BACKGROUND

1. Technical Field

The present disclosure relates to earphone jack drive circuits, and more particularly to an earphone jack drive circuit for eliminating noise generated by plugging or unplugging an earphone in or out of an electronic device.

2. Description of Related Art

Earphones are connected to an audio source via an earphone jack, and always controlled to switch between a mute mode and a normal mode by a micro-controller. The micro-controller may have a detect pin to detect if the earphone is plugged in an electronic device, and a control pin to switch between the mute mode or the normal mode. When the earphone is unplugged, the detect pin is pulled up to logic high (high voltage), the control pin is pulled down to logic low (low voltage) to enter into the mute mode. When the earphone is plugged in, the detect pin is pulled down to the logic low, the control pin is pulled up to the logic high to control to enter into the normal mode. However, during plugging in and unplugging out of the earphone, because of the unstable connection and electrical bouncing between the earphone and the earphone jack, the detect pin will be flickering between the logic low and the logic high, which causes noise such as a popping sound.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments.

The drawing is a schematic circuit diagram of one embodiment of earphone jack drive circuit in accordance with the present disclosure.

DETAILED DESCRIPTION

Embodiments of the present disclosure will be described below, with reference to the accompanying drawings.

The earphone jack drive circuit 10 can be applied in any multimedia electronic device such as an MP3 player and a mobile phone. Referring to the drawing, an earphone jack drive circuit 10 for eliminating noise generated by plugging an earphone 20 in or out of an electronic device using the earphone jack drive circuit 10 is disclosed. The earphone jack drive circuit 10 includes a micro-controller 12, a delay switch circuit 14 and a mute circuit 16.

The mute circuit 16 is connected with the micro-controller 12, and controlled to switch between a mute mode and a normal mode by the micro-controller 12.

The micro-controller 12 includes a detect pin a and a control pin b. The detect pin a is connected with the earphone jack 20. The detect pin a is pulled up to a logic high (high voltage) when the earphone jack 20 is not plugged and pulled down to a logic low (low voltage) when the earphone jack 20 is plugged in. During the plugging in of the earphone 20, a voltage of the multimedia electronic device will not be stable, flickering between logic low and logic high. The micro-controller 12 is used to set the control pin b to be the logic low when the detect pin a is pulled up to the logic high, thereby controlling the mute circuit 16 to enter into the mute mode. The micro-controller 12 is further used to set the control pin b to be logic high when the detect pin a is pulled down to the logic low, thereby controlling the mute circuit 16 to enter into the normal mode.

The delay switch circuit 14 includes a resistance 140, a capacitance 142, an npn transistor 144, and a first current-limiting resistance 146. A base of the npn transistor 144 is connected with the detect pin a via the resistance 140, a connector of the npn transistor is connected with a system voltage Vbat (usually 3.3V) via the first current-limiting resistance 146, an emitter of the npn transistor 144 is grounded, and also connected to the detect pin a via the capacitance 142. The resistance 146, the control pin b, the connector of the npn transistor 144 and the mute circuit 16 form a node A.

During the plugging in of the earphone 20 into the electronic device, the detect pin a detects the flicker between logic low and logic high, the capacitance 142 is charged by any momentary logic high, and discharges via the resistance 140 when the logic high changes to the logic low, thereby the detect pin a and the base of the npn transistor 144 are pulled up to the logic high. When a voltage of the capacitance 142 is lower than the voltage between the base and the emitter (0.7V), the npn transistor 144 is turned off. When the npn transistor 144 is turned on, the node A is grounded, thereby the voltage of the node A is pulled down to the logic low. When the npn transistor 144 is turned off, the node A is separated from ground, and the voltage of the node A is same as that of the control pin b. During the plugging in of the earphone 20, the capacitance 142 discharges its stored voltage to keep the npn transistor 144 on for a short period, thereby the voltage of the node A is set to be logic low for the short period. When the short period expires, the earphone 20 has already been plugged in and fully connected, and so draws a stable voltage. The voltage of the node A is set to be logic low for the short period and then goes to the logic high, which controls the mute circuit 16 to perform the mute mode for the period and then enter into the normal mode, thereby no popping or similar noise will be generated in the period after plugging in the earphone 20.

When the earphone 20 is fully plugged in, the detect pin a is set to be logic low, the npn transistor 144 is turned off, the voltage of the node A is same as the voltage of the control pin b which is set to be logic high, thereby controlling the mute circuit 16 to perform the normal mode.

During the unplugging of the earphone 20 out of the electronic device, the detect pin a detects the flicker between logic low and logic high, the capacitance 142 absorbs and is charged by any momentary logic highs, and discharges via the resistance 140 when the logic high is changed to the logic low Thereby the detect pin a and the base of the npn transistor 144 are pulled up to the logic high when the voltage of the capacitance 142 is lower than voltage between the base and the emitter (0.7V), so the npn transistor 144 is turned off. When the npn transistor 144 is turned on, the node A is grounded, thereby a voltage of the node A is pulled down to the logic low. When the npn transistor 144 is turned off, the node A is disconnected from ground, the voltage of the node A is same as that of the control pin b. During plugging and unplugging of the earphone 20 in and out of the electronic device, the capacitance 142 discharges to keep the npn transistor 144 on for an another period, thereby the voltage of the node A is set to be logic low for the another period. When the another period is expired, the earphone 20 should be already unplugged, the voltage of the node A is set to be the logic low for the another period, which controls the mute circuit 16 to perform the mute mode for the another period, thereby no noise will be generated by unplugging the earphone 20 out during the another period.

When the earphone 20 is not plugged in to the electronic device, the detect pin a is set to be logic high, the capacitance 142 is charged, the base of the npn transistor 144 is pulled to the logic high, the npn transistor 144 is turned on, the node A is grounded and set to be logic low, thereby controlling the mute circuit 16 to perform the mute mode.

The delay switch circuit 14 further includes a first Zener diode 128 connected between the detect pin a and the resistance 140 and the capacitance 142 to reduce the influences by unstable connection and electrical bouncing between the earphone 20 and detect pin a.

Many systems to which the mute circuit 16 are applied require the logic low as a signal to perform the normal mode and the logic high as the signal to perform the mute mode. For this reason, the earphone jack drive circuit 10 additionally includes an inverting circuit 18 connected between the delay switch circuit 14 and the mute circuit 16. The inverting circuit 18 includes a pnp transistor 184. A base of the pnp transistor 184 is connected with the node A via a second current-limiting resistance 182, a connector of the pnp transistor 184 is connected with the system voltage Vbat (3.3V), an emitter of the pnp transistor 184 is grounded via a third current-limiting resistance 186, and connected with the mute circuit 16. When the node A is pulled up to the logic high, the mute circuit 16 is controlled to perform the mute mode, and the pnp transistor 184 is turned off. As the emitter of the pnp transistor 184 is grounded, and the emitter of the pnp transistor 184 is connected with the input port of the mute circuit 16, the input port of the mute circuit 16 is set to be logic low, controlling the mute circuit 16 to perform the normal mode. When the node A is pulled down to the logic low to control the mute circuit 16 to perform the normal mode, the pnp transistor 184 is turned on. As the connecter of the pnp transistor 184 is connected with the system voltage, the input port of the mute circuit 16 is set to be logic high to control the mute circuit 16 to perform the mute mode.

The inverting circuit 18 further includes a second Zener diode 188 connected between the emitter of the pnp transistor 184 and the mute circuit 16 to reduce the influences of fluctuation of the system voltage Vbat.

During the plugging or unplugging of the earphone 20 in or out of the electronic device, the momentary logic high of the detect pin a charges the capacitance 142, the capacitance 142 discharges when the detect pin a is pulled down to the logic low, the npn transistor 144 keeps on for a period, thereby the connector of the npn transistor 144 and the input port of the mute circuit 16 are set to be logic low for the period, and the mute circuit 16 is controlled to perform the mute mode for the period, and thus no noise will be generated during the period.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An earphone jack drive circuit comprising:
   a mute circuit;
   a micro-controller, comprising a detect pin and a control pin, wherein the detect pin is connected with an earphone jack, pulled up to a logic high when the earphone jack is not plugged in and pulled down to a logic low when the earphone jack is plugged in, the control pin is set to be logic low when the detect pin is pulled up to the logic high, thereby controlling the mute circuit to enter into the mute mode, and to the logic high when the detect pin is pulled down to the logic low, thereby controlling the mute circuit to enter into the normal mode;
   a delay switch circuit, further comprising a resistance, a capacitance, a npn transistor and a first current-limiting resistance, wherein a base of the npn transistor is connected with the detect pin via the first current-limiting resistance, a connector of the npn transistor is connected with a system voltage via the first current-limiting resistance, and connected with an input port of the mute circuit, an emitter of the npn transistor is grounded, and connected with the detect pin via the capacitance;
   wherein during plugging in and unplugging out of an earphone, a momentary logic high of the detect pin charges the capacitance, the capacitance discharges when the detect pin is set to logic low, the npn transistor is kept on for a period and the connector of the npn transistor is set to logic low for the period, the input port of the mute circuit is set to logic low for the period, thereby the mute circuit is controlled to perform the mute mode for the period to eliminate noise generated by plugging or unplugging out the earphone.

2. The earphone jack drive circuit of claim 1, wherein the delay switch circuit further comprises a first Zener diode connected between the detect pin a and the resistance and the capacitance to reduce unstable connection and electrical bouncing between the earphone and detect pin.

3. The earphone jack drive circuit of claim 1, further comprising an inverting circuit connected between the delay switch circuit and the mute circuit, for inverting an output voltage of the delay switch circuit.

4. The earphone jack drive circuit of claim 3, wherein the inverting circuit comprises a pnp transistor, a base of the pnp transistor is connected with the connector of the npn transistor via a second current-limiting resistance, a connector of the pnp transistor is connected with the system voltage Vbat, an emitter of the pnp transistor is grounded via a third current-limiting resistance, and connected with the mute circuit, thereby the input port of the mute circuit is set to be logic low to control the mute circuit to perform the normal mode, and set to be logic high to control the mute circuit to perform the mute mode.

5. The earphone jack drive circuit of claim 3, wherein the inverting circuit further comprises a second Zener diode connected between the emitter of the pnp transistor and the mute circuit to reduce the influences of fluctuation of the system voltage.

6. The earphone jack drive circuit of claim 1, wherein the system voltage is 3.3V.

* * * * *